United States Patent
Kuratani et al.

(10) Patent No.: US 6,791,238 B2
(45) Date of Patent: Sep. 14, 2004

(54) EDGE REFLECTION TYPE SURFACE ACOUSTIC WAVE DEVICE AND MANUFACTURING METHOD FOR THE SAME

(75) Inventors: Yasuhiro Kuratani, Kyoto (JP); Takao Mukai, Ishikawa-ken (JP); Tomoyasu Miyata, Kanazawa (JP); Hideharu Yoshikawa, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 2 days.

(21) Appl. No.: 10/242,602

(22) Filed: Sep. 13, 2002

(65) Prior Publication Data

US 2003/0071539 A1 Apr. 17, 2003

(30) Foreign Application Priority Data

Sep. 14, 2001 (JP) ........................................ 2001-279575

(51) Int. Cl.[7] .................................................. H03H 9/25
(52) U.S. Cl. ................................ 310/313 D; 310/313 R
(58) Field of Search ....................................... 310/313 R

(56) References Cited

U.S. PATENT DOCUMENTS 5,260,913 A * 11/1993 Kadota et al. .............. 367/140
6,377,139 B1 * 4/2002 Horiuchi et al. ............ 333/193

FOREIGN PATENT DOCUMENTS

| JP | 04-082315 | 3/1992 | ............ H03H/9/25 |
| JP | 2002-261559 | * 9/2002 | ............ H03H/3/08 |

* cited by examiner

Primary Examiner—Thomas M. Dougherty
(74) Attorney, Agent, or Firm—Keating & Bennett, LLP

(57) ABSTRACT

A method of manufacturing an edge reflection type surface acoustic wave device using a Shear Horizontal type surface acoustic wave includes the steps of making a first half cut defining first end surface portions having a smooth surface, that is, opposing two end surfaces which function as reflection end surfaces, from the upper surface of a piezoelectric substrate after at least one of a plurality of IDTs has been formed on the upper surface of the piezoelectric substrate, making a second half cut for forming second end surface portions having a rough surface after making the first cut, and making a full cut for cutting the piezoelectric substrate so as to reach the lower surface of the piezoelectric substrate outside of the second end surface portions in the surface acoustic wave propagation direction.

5 Claims, 8 Drawing Sheets

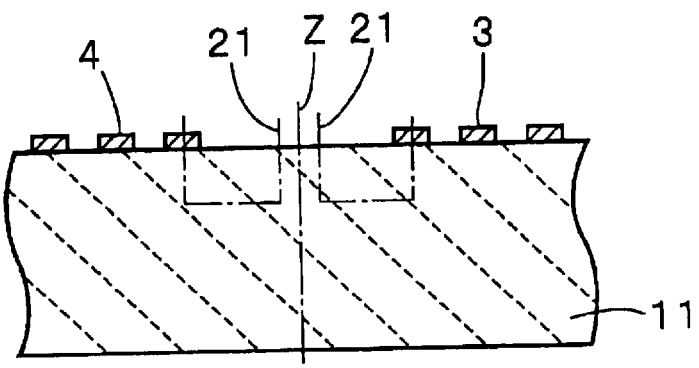
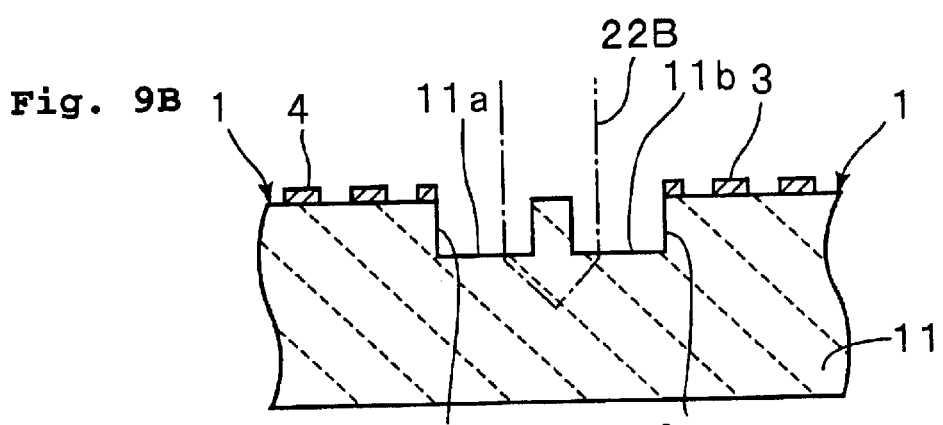
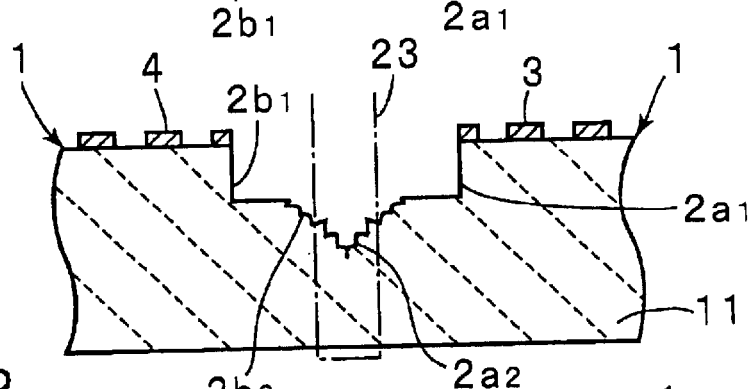
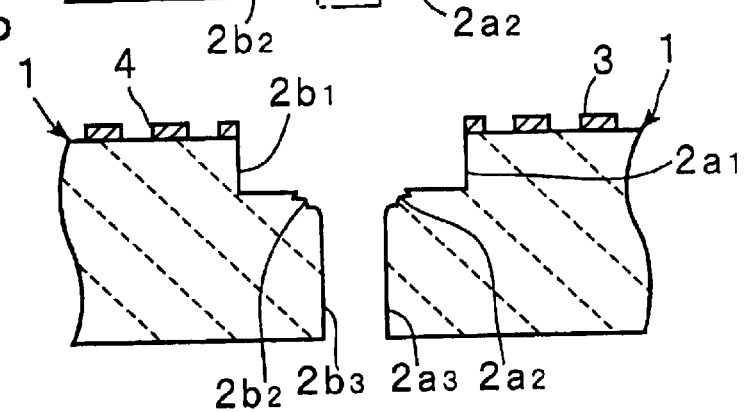

EDGE REFLECTION TYPE SURFACE ACOUSTIC WAVE DEVICE AND MANUFACTURING METHOD FOR THE SAME

BACKGROUND OF THE INVENTION

1. Field of the Invention

The present invention relates to a surface acoustic wave device used for resonators and bandpass filters and more particularly, to an edge reflection type surface acoustic wave device having a construction in which a Shear Horizontal (SH) type surface acoustic wave is reflected between two opposing end surfaces and a manufacturing method for the same.

2. Description of the Related Art

Various edge reflection type surface acoustic wave devices using of SH waves such as a BGS wave, a lobe wave, etc., reflected between confronting end surfaces have been proposed.

In the edge reflection type surface acoustic wave device, the SH wave is reflected between the opposing two end surfaces, and, in this case, there is a problem that, when unnecessary waves other than the SH waves are reflected at the end surfaces, undesired ripples appear in the characteristics and the deviation of GDT (group delay time characteristics) increases.

In Japanese Unexamined Patent Application Publication No. 4-82315, a construction in which a bulk wave producing unnecessary spurious noise is suppressed, is shown in an edge reflection type surface acoustic wave device. Here, stair portions are provided at a height which is a thickness portion of the piezoelectric substrate where 80% of the energy of the SH wave is concentrated or farther away from the surface of the piezoelectric substrate, on the opposing two end surfaces which are used as reflection end surfaces. The energy of a bulk wave spreads over the entire thickness area of the piezoelectric substrate, but, on the other hand, the energy of the SH wave is concentrated in a layer that is close to the surface of the piezoelectric substrate. Therefore, in this prior art device, the above-noted difference of deviation of the energy between the SH wave and a bulk wave is utilized and the resonance of the SH wave is effectively utilized in the layer of the piezoelectric substrate on the surface side of the piezoelectric substrate beyond the stair portion. On the other hand, the resonance of a bulk wave has no effect in the layer of the piezoelectric substrate that is lower than the stair, and accordingly, the spurious noise to be produced by a bulk wave is suppressed.

Furthermore, in this prior art, it is also shown that irregular reflection of a bulk wave is produced by making the end surface portions which are lower than the stair, a rough surface and, as a result, the resonance energy of a bulk wave is reduced.

However, in this prior art, it is also shown that it is not necessary to make the end surface portions which are lower than the stair a rough surface.

Furthermore, in FIG. 5 of the 4-82315, a construction in which second and third end surface portions are formed two stairs away from end surface portions provided on the side of the surface on which the electrodes of the piezoelectric substrate are formed and below the end surface portions, is shown, and here, it is also shown that, below each stair, the second and third end surface portions may be appropriately made to have a rough surface.

As disclosed in Japanese Unexamined Patent Application Publication No. 4-82315, in the past, a method in which, in an edge reflection type surface acoustic wave device, the end surfaces are made to have a rough surface in order to suppress the reflection of unnecessary waves such as a bulk wave, etc., on the end surfaces is shown. However, when two opposing end surfaces of a piezoelectric substrate are cut by using a blade under the condition that the end surfaces become a rough surface, there is a problem in that cracks are produced on the end surfaces and in that chipping is likely to occur in the edge portion between the end surface and the bottom surface of the piezoelectric substrate.

That is, it is very difficult to obtain an edge reflection type surface acoustic wave device in which ripples and spurious noise are fully suppressed and cracks, chipping, etc., are not produced.

SUMMARY OF THE INVENTION

In order to overcome the problems described above, preferred embodiments of the present invention provide a method of manufacturing an edge reflection type surface acoustic wave device in which the above-described defects in the prior art are solved, the degradation of characteristics due to the reflection of unnecessary waves on the end surfaces is prevented from occurring, and cracks and chipping are prevented from occurring, and also provide an edge reflection type surface acoustic wave device produced by such a method of manufacturing.

A preferred embodiment of the present invention provides a method of manufacturing an edge reflection type surface acoustic wave device including a piezoelectric substrate having opposing two end surfaces and at least one IDT provided on the piezoelectric substrate and in which an SH type surface acoustic wave is reflected between the opposing two end surfaces, the method including the steps of preparing a piezoelectric substrate, forming at least one IDT on the upper surface of the piezoelectric substrate, performing a first half cut in the piezoelectric substrate in order to form opposing two end surfaces defining reflection end surfaces in which the piezoelectric substrate is half cut from the upper surface of the piezoelectric substrate to a depth not reaching the lower surface of the piezoelectric substrate by using a first blade such that first end surface portions having a smooth surface defining reflection end surfaces are formed, performing a second half cut in which, after the first half cut, the piezoelectric substrate is cut to a depth not reaching the lower surface of the piezoelectric substrate by using a second blade so as to form second end surface portions having a rough surface such that the second end surface portions of the rough surface are arranged below the first end surface portions on the outside of the first end surface portions in the surface acoustic wave propagation direction, and performing a full cut in which the piezoelectric substrate is cut by using a third blade so as to reach the lower surface of the piezoelectric substrate at a location outside of the second end surface portion in the surface acoustic wave propagation direction.

In this preferred embodiment of the present invention, the first half cut, the second half cut, and the full cut are performed when the substrate is in the state of a mother piezoelectric wafer. The mother piezoelectric wafer is divided to obtain separate individual surface acoustic wave devices in the step of performing the full cut. Accordingly, an edge reflection type surface acoustic wave device can be effectively mass-produced from a piezoelectric wafer in accordance with preferred embodiments of the present invention.

In this preferred embodiment of the present invention, the second half cut may be performed before or after the step of performing the full cut.

In this preferred embodiment of the present invention, the thickness of a second blade used in the step of performing the second half cut is larger than the thickness of a third blade used in the step of performing the full cut. Accordingly, the second half cut is formed in a mother piezoelectric wafer by using the second blade to form a groove. Then, a full cut is performed in the groove using the third blade, the thickness of which is smaller than the second blade and, as a result, the adjacent edge reflection type surface acoustic wave devices can be surely cut below the second end surface portions.

In a preferred embodiment of the present invention, the second half cut is performed twice by displacing the second blade in the surface acoustic wave propagation direction, and the full cut is performed by using the third blade, the width of which is smaller than the width in the middle of the groove. In this case, since a groove, the width of which is larger than the thickness of the second blade in the step of the second half cut, a full cut can be easily performed using a third blade which is thinner than the width of the groove.

In this preferred embodiment of the present invention, the full cut is performed after the step of performing the first half cut and then the step of performing the second half cut is executed. Thus, in a method of manufacturing according to the first preferred embodiment of the present invention, the full cut is not necessarily required to be performed after the step of performing the second half cut. Even if the full cut is performed before the step of performing the second half cut, the second half cut can be executed so as to surely make the second end surface portion a rough surface in the step of performing the second half cut. Moreover, in this case, in the step of performing the second half cut, the second end surface portion linked below the first end surface portion is formed above the last end surface portion formed in the full cut.

In a preferred embodiment of the present invention, the method of manufacturing an edge reflection type surface acoustic wave device further includes a step of performing a second full cut, in which a mother piezoelectric wafer is full cut in the direction that is substantially perpendicular to the reflection end surface in order to obtain separate individual surface acoustic wave devices from the mother piezoelectric wafer, and the second full cut is performed before the steps of making the first half cut, the second half cut, and the full cut. In this case, the second full cut is performed such that each of surface acoustic wave devices are linked on the side of the opposing two end surfaces, and then the first half cut, the second half cut, and the full cut are performed in accordance with preferred embodiments of the present invention. Therefore, it is desirable to execute the first half cut, the second half cut, and the full cut in the strip-shaped piezoelectric wafer portion. This is because the effect of the pressure to be applied to a piezoelectric wafer can be reduced when the wafer is mounted to or removed from a dicer.

Furthermore, the second full cut may be performed between the step of the first cut and the step of the second half cut. Also in this case, it is desirable to execute the first cut, the second cut, and the full cut in the strip-shaped piezoelectric wafer portion. This is because the effect of the pressure to be applied to a piezoelectric wafer can be reduced when the wafer is mounted on or removed from a dicer.

In a preferred embodiment invention, an edge reflection type surface acoustic wave device, in which a first end surface portion and last end surface portion having a smooth surface and a second end surface portion having a rough surface are provided, can be obtained in accordance with the present invention.

Another preferred embodiment of the present invention provides an edge reflection type surface acoustic wave device including a piezoelectric substrate having two opposing end surfaces defining reflection end surfaces, at least one IDT disposed on the piezoelectric substrate, first end surface portions having a smooth surface and defining two opposing end surfaces extending from the upper surface to a height not reaching the lower surface of the piezoelectric substrate, last end surface portions having a smooth surface extending upward from the lower surface of the piezoelectric substrate and disposed outside of the first end surface portions in the surface acoustic wave propagation direction, and second end surface portions having a surface roughness Ra of approximately $0.006\lambda$ or greater, disposed between the first end surface portions and the last end surface portions.

In an edge reflection type surface acoustic wave device according to this preferred embodiment of the present invention, since the smooth first end surface portions and last end surface portions and the second end surface portions having a rough surface with a surface roughness Ra of about $0.006\lambda$ or more, which is disposed between the first end surface portions and last end surface portions, are provided as two opposing end surfaces, undesirable reflections of unnecessary waves are effectively prevented at the second end surface portions. Accordingly, the first end surface portions function as reflection end surfaces and the SH wave is reflected very well and the degradation of characteristics due to the reflection of unnecessary waves on the opposing two end surfaces is reliably prevented.

In an edge reflection type surface acoustic wave device of a preferred embodiment of the present invention, when the dimension in the depth direction of the first end surface portions is represented by d1, it is preferred that $1.8\ \lambda \leq d1 \leq 3.5\ \lambda$, and, in this case, as clearly understood in the preferred embodiment described later, the reflection of unnecessary waves is even more effectively prevented.

Furthermore, in an edge reflection type surface acoustic wave device of a preferred embodiment of the present invention, when the dimension in the depth direction of the first end surface portions is represented by d2, it is preferred that $d2 \geq 0.5\ \lambda$, and, in this case, degradation of characteristics due to the reflection of unnecessary waves at the opposing two end surfaces is even more effectively prevented.

An edge reflection type surface acoustic wave device of another preferred embodiment of the present invention includes a piezoelectric substrate having two opposing end surfaces defining reflection end surfaces, at least one IDT disposed on the piezoelectric substrate, first end surface portions having a smooth surface defining the reflection end surfaces and extending from the upper surface to a height not reaching the lower surface of the piezoelectric substrate, last end surface portions having a smooth surface extending upward from the lower surface of the piezoelectric substrate and disposed outside of the first end surface portions in the surface acoustic wave propagation direction, and second end surface portions having a rough surface and disposed between the first end surface portions and the last end surface portions, wherein when the dimension in the depth direction of the first end surface portions is represented by d1, $1.8\ \lambda \leq d1 \leq 3.5\ \lambda$.

An edge reflection type surface acoustic wave device of another preferred embodiment of the present invention includes a piezoelectric substrate having two opposing end surfaces defining reflection end surfaces, at least one IDT disposed on the piezoelectric substrate, first end surface portions having a smooth surface defining the reflection end surfaces extending from the upper surface to a height not reaching the lower surface of the piezoelectric substrate, last end surface portions of a smooth surface extending upward from the lower surface of the piezoelectric substrate and disposed outside of the first end surface portions in the surface acoustic wave propagation direction, and second end surface portions of a rough surface and disposed between the first end surface portions and the last end surface portions, wherein when the dimension in the depth direction of the second end surface portions is represented by d2, $d2 \geqq 0.5\lambda$.

Other features, elements, characteristics and advantages of the present invention will become more apparent from the following detailed description of preferred embodiments of the present invention with reference to the attached drawings.

BRIEF DESCRIPTION OF THE DRAWINGS

FIGS. 9A to 9D shows partially cutaway sectional views for describing a fourth manufacturing method according to a preferred embodiment of a manufacturing method of the present invention.

DETAILED DESCRIPTION OF PREFERRED EMBODIMENTS

Hereinafter, specific preferred embodiments of the present invention are described with reference to the drawings in order to make the present invention clear.

Figure 1A:
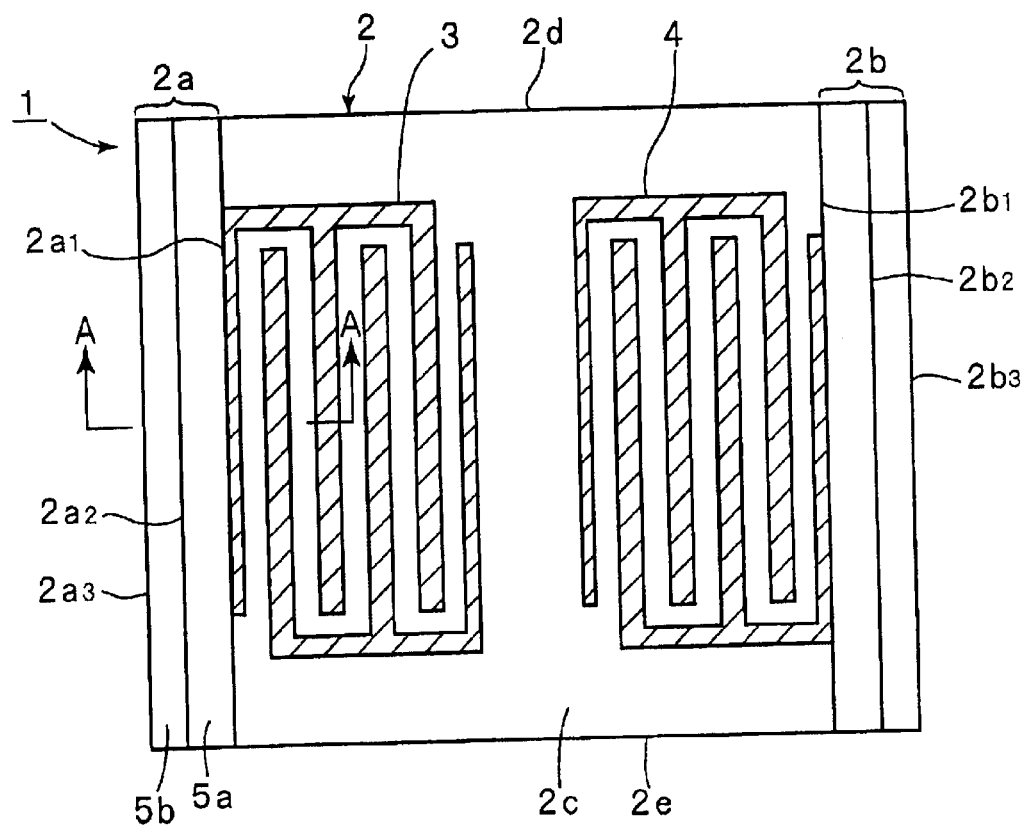
FIG. 1A is a top view of an edge reflection type surface acoustic wave device according to a preferred embodiment of the present invention and FIG. 1B is a partially cutaway sectional front view taken on line A—A of FIG. 1A.
Figure 1B:
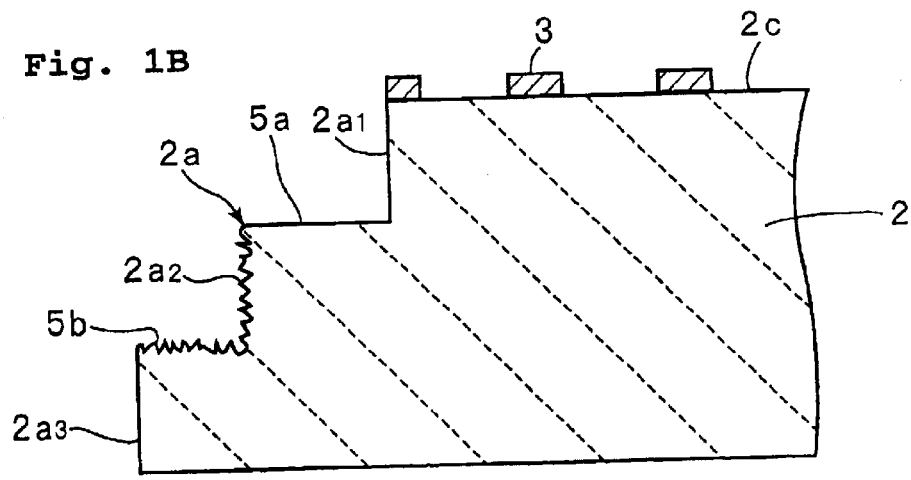

FIG. 1A is a top view of an edge reflection type surface acoustic wave device obtained by a manufacturing method for an edge reflection type surface acoustic wave device according to a preferred embodiment of the present invention, and FIG. 1B is a partially enlarged sectional front view taken on line A—A of FIG. 1A.

An edge reflection type surface acoustic wave device 1 preferably includes a piezoelectric substrate 2. The piezoelectric substrate 2 is preferably a substantially rectangular plate and has end surfaces 2a and 2b which are opposed to each other.

The piezoelectric substrate 2 is preferably made of a piezoelectric single crystal such as $LiTaO_3$, $LiNbO_3$, quartz, or other suitable material, or piezoelectric ceramics such as titanate zirconate lead ceramics. IDTs 3 and 4 are disposed on the upper surface of the piezoelectric substrate 2. The IDTs 3 and 4 include a plurality of electrode fingers to fit together by insertion therebetween. The IDTs 3 and 4 are separated in the propagation direction of a surface acoustic wave, and, in the present preferred embodiment, the SH wave (Shear Horizontal Wave) as a surface acoustic wave propagates in the direction substantially at a right angle to the direction in which the electrode fingers of the IDTs 3 and 4 extend. Accordingly, the SH wave is reflected by the end surfaces 2a and 2b.

In the present preferred embodiment, a longitudinally coupled resonator type surface acoustic wave filter, in which the SH wave is reflected between the two confronting end surfaces 2a and 2b, is provided.

One of the unique characteristics of the edge reflection type surface acoustic wave device of the present preferred embodiment is the construction of the end surfaces 2a and 2b. As shown in FIG. 1B, in the end surfaces 2a, a smooth end surface portion $2a_1$ extending downward from the upper surface 2c of the piezoelectric substrate 2, a second end surface portion $2a_2$ arranged so as to extend downward a stair 5a away from the bottom of the first end surface portion $2a_1$, and a third end surface portion $2a_3$ located a stair 5b away from the bottom of the second end surface portion $2a_2$ are provided. The third end surface portion $2a_3$ has a smooth surface to define a smooth end surface portion, and the second end surface portion $2a_2$ has a rough surface. More specifically, in the second end surface portion $2a_2$, surface roughness Ra specified in JIS B0601 is preferably about 0.006 λ (λ represents a wavelength of the surface acoustic wave) or greater, and, because of that, as will be made clear by a preferred embodiment to be described later, the influence of reflection of unnecessary waves on characteristics is eliminated.

In this way, based on specific experimental examples, it is possible to prevent the gradation of characteristics due to the reflection of unnecessary waves by making the second end surface portion $2a_2$ disposed in the middle to have the surface roughness in the specified range.

Figure 2:
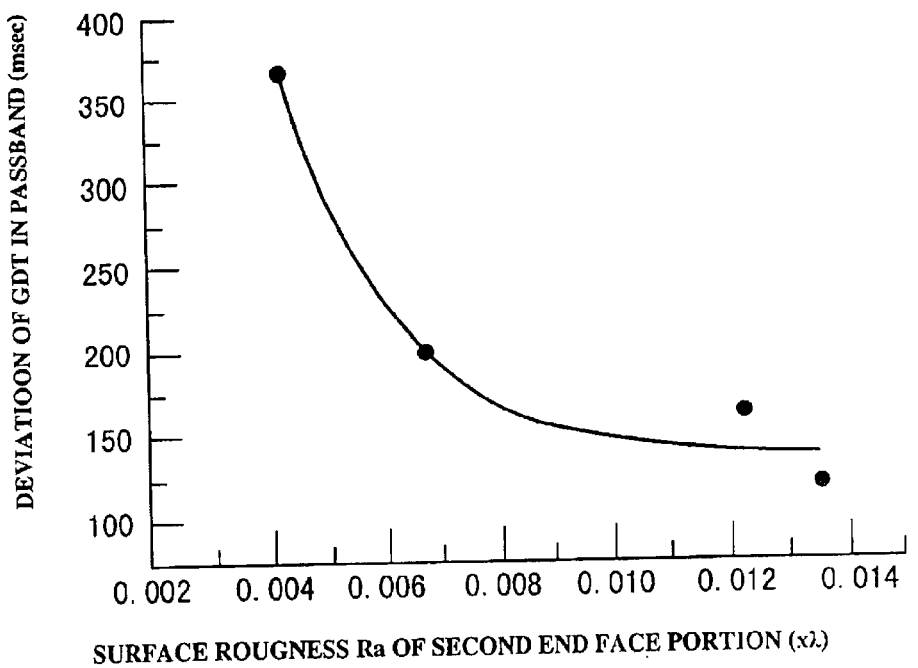
FIG. 2 shows the relationship between the surface roughness Ra of second end surface portions and the deviation of GDT in the passband.

As an example of an edge reflection type surface acoustic wave device 1 of the present preferred embodiment, the IDTs 3 and 4 are formed on a piezoelectric substrate having approximate dimensions of 1.5×2.5×0.4 in thickness (mm), and the dimension d1 in the direction of depth of the first end surface portion $2a_1$ is about 3 λ, the dimension in the direction of depth of the second end surface portion $2a_2$ is about 3 λ, and then, when the surface roughness Ra of the second end surface portion $2a_2$ is variously changed, the change of characteristics was investigated. The result is shown in FIG. 2. Moreover, on the other end surface 2b, the first and second end surface portions $2b_1$ and $2b_2$ and the third end surface portion $2b_3$ were constructed in the same way as on the side of the end surface $2a$.

The horizontal axis in FIG. 2 represents surface roughness of the second end surface portions $2a_2$ and $2b_2$, and the vertical axis represents the deviation of GDT in the passband.

As is clearly seen in FIG. 2, when the surface roughness Ra of the second end surface portions becomes about 0.006 λ or more, the deviation of GDT in the passband becomes very small.

Therefore, it is understood that an edge reflection type surface acoustic wave device 1 having excellent characteristics can be obtained by making the surface roughness Ra of the second end surface portions $2a_2$ and $2b_2$ to be about 0.006 λ or more.

Figure 3:
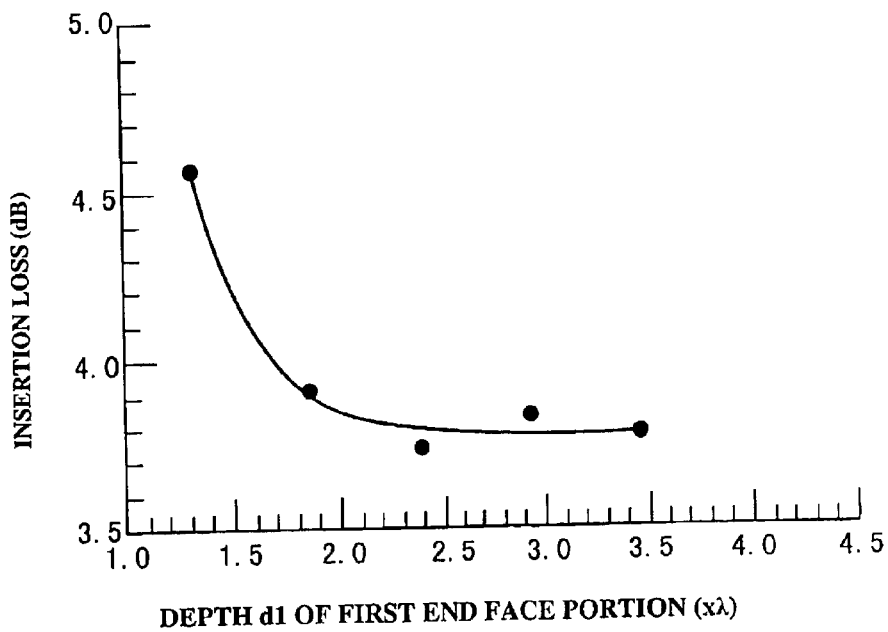
FIG. 3 shows the relationship between the dimension d1 in the direction of depth of first end surface portions and the insertion loss.
Figure 4:
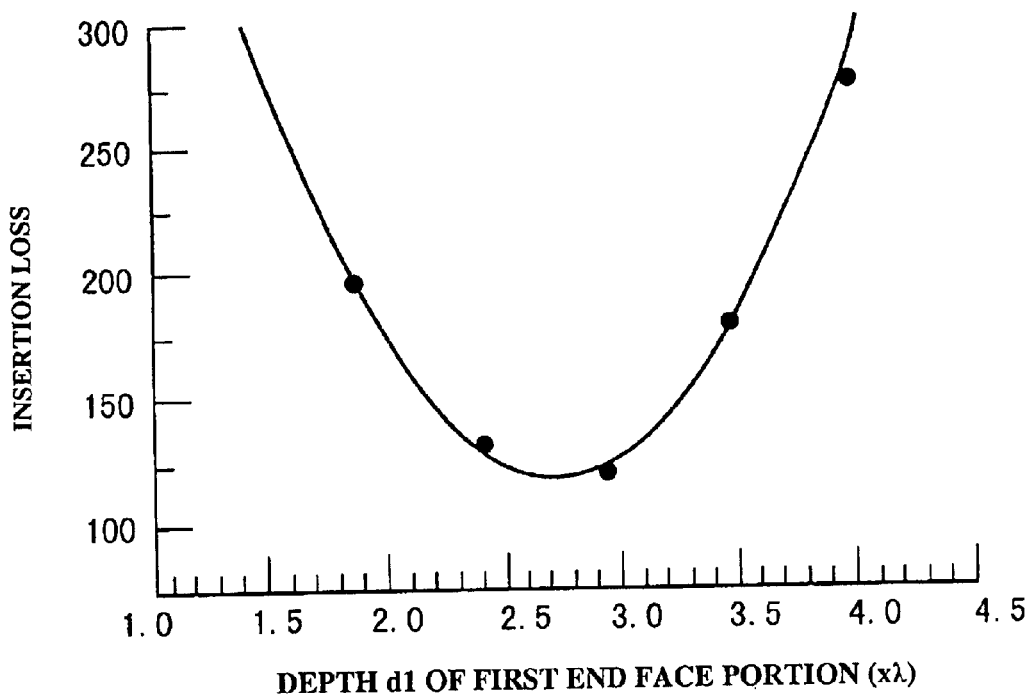
FIG. 4 shows the relationship between the dimension d1 in the direction of depth of first end surface portions and the deviation of GDT in the passband.

Next, when the same piezoelectric substrate as in the above experimental example is used and various edge reflection type surface acoustic wave devices are produced by changing the dimension d1 in the depth direction of the first end surface portions $2a_1$ and $2b_1$ while the dimension in the depth direction of the second end surface portions $2a_2$ and $2b_2$ is approximately 3 λ, the insertion loss and the deviation of GDT in the passband were measured. The result is shown in FIGS. 3 and 4. As clearly seen in FIGS. 3 and 4, it is understood, when the dimension d1 in the depth direction of the first end surface portions is less than about 1.8 λ, the insertion loss increases. Accordingly, in order to decrease the insertion loss, it is desirable to make the dimension d1 about 1.8 λ or more.

Furthermore, as clearly seen in FIG. 4, the deviation of GDT in the passband is not larger than about 200 nsec when the dimension d1 is in the range of about 1.8 λ to about 3.5 λ. Therefore, the low loss is preferably realized by making the dimension d1 approximately $1.8 \lambda \leq d1 \leq 3.5 \lambda$ and excellent characteristics having a much smaller deviation of GDT can be obtained.

Next, the deviation of GDT characteristics in the passband was investigated when the dimension d2 in the depth direction of the second end surface portions $2a_2$ and $2b_2$ is changed while the dimension of the first end surface portions $2a_1$ and $2b_1$ is about 3 λ. The result is shown in FIG. 5.

Figure 5:
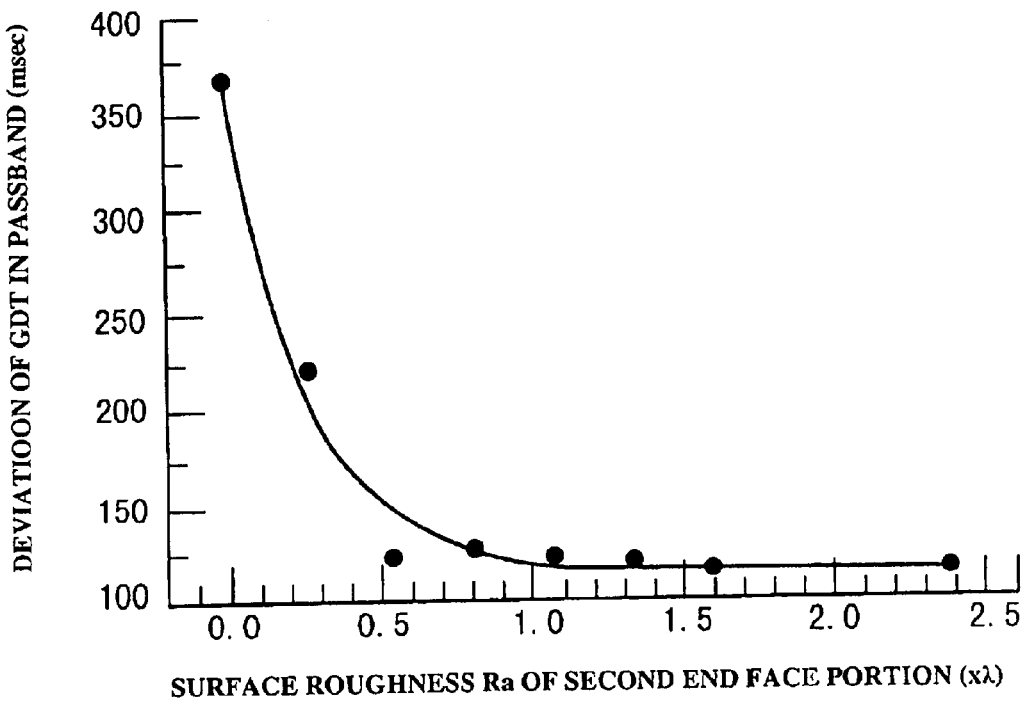
FIG. 5 shows the relationship between the dimension d2 in the direction of depth of second end surface portions and the deviation of GDT in the passband.

As clearly seen in FIG. 5, when the dimension d2 in the depth direction of the second end surface portions $2a_2$ and $2b_2$ is less than about 0.5 λ, the deviation of GDT in the passband increases. Therefore, when the deviation d2 is about 0.5 λ or more, the deviation of GDT in the passband can be reduced. Accordingly, in an edge reflection type surface acoustic wave device according to preferred embodiments of the present invention, first, as is made clear by the result in FIG. 2, the deviation of GDT inside the passband can be reduced by making the surface roughness Ra of the second end surface portions $2a_2$ and $2b_2$ to be about 0.006 λ or more.

Furthermore, when the second end surface $2a_2$ is a rough surface, the loss and the deviation of GDT can be reduced by setting the depth d1 of the first end surface portions $2a_1$ and $2b_1$ in the range of about 1.8 λ to about 3.5 λ. In this case, it has been experimentally confirmed by the inventor of the present application that the surface roughness Ra of the second end surface portions $2a_2$ and $2b_2$ is not necessarily required to be about 0.006 λ or more.

Furthermore, in the edge reflection type surface acoustic wave device 1, as clearly seen in FIG. 5, the dimension d2 in the depth direction of the second end surfaces $2a_2$ and $2b_2$ is preferably about 0.5 λ or more, and as a result, the deviation of GDT in the passband can be reduced. In this case, it has been confirmed by the inventor of the present application that the surface roughness Ra of the second end surface portions $2a_2$ and $2b_2$ is not necessarily required to be about 0.006 λ or more to reduce the deviation of GDT in the passband.

Next, a manufacturing method for an edge reflection type surface acoustic wave device 1 is described with reference to FIGS. 6 to 10.

In FIGS. 6A to 6D, partially cutaway sectional views showing a first example of a manufacturing method of a preferred embodiment of the present invention are shown.

Figure 6A:
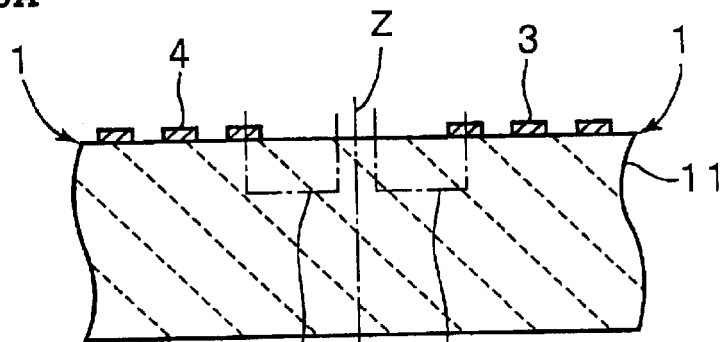
FIGS. 6A to 6D shows partially cutaway sectional views for describing a first manufacturing method according to a preferred embodiment of a manufacturing method of the present invention.

In the first manufacturing method, IDTs 3 and 4 for constituting a plurality of edge reflection type surface acoustic wave devices 1 are arranged in the shape of a matrix on a mother piezoelectric wafer. In FIG. 6A, the portion where adjacent edge reflection type surface acoustic wave devices 1 confront each other is typically shown. An alternate long and short dash line shows the boundary between the adjacent edge reflection type surface acoustic wave devices 1.

Figure 6B:
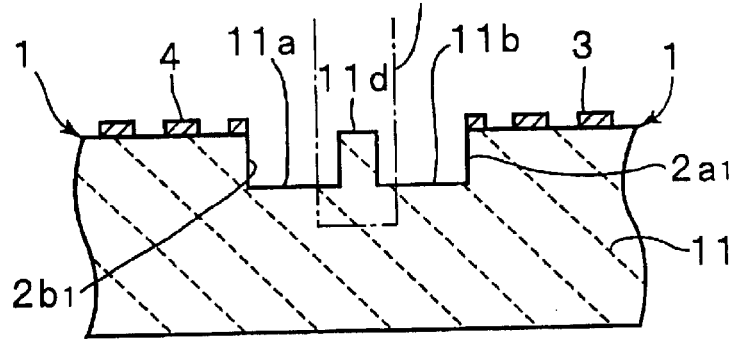
Figure 6C:
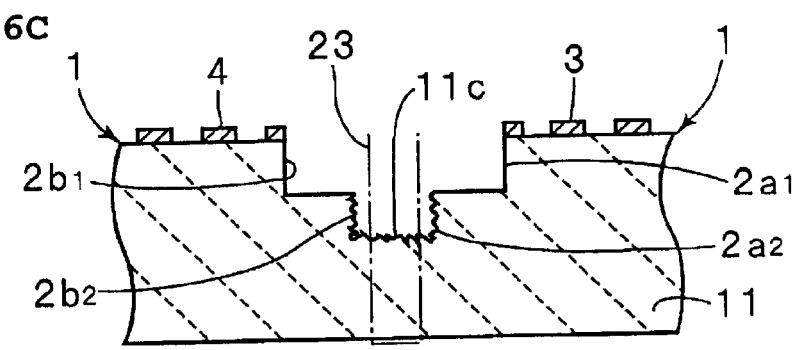
Figure 6D:
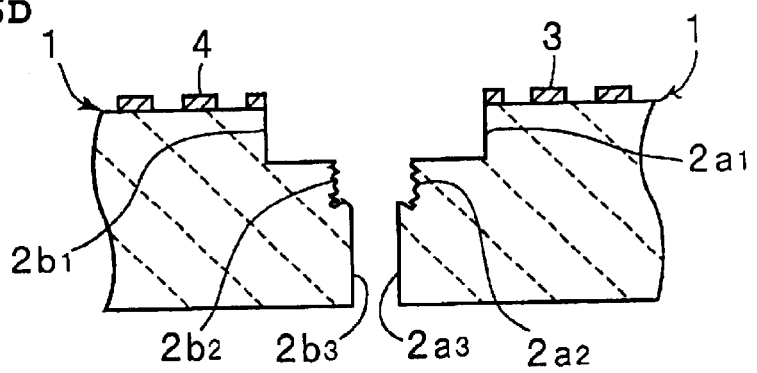

On the upper surface of the above-mentioned piezoelectric wafer 11, first of all, the piezoelectric wafer 11 is half cut by using first blades 21 shown by imaginary lines (FIG. 6A). In the step of making the half cut, the half cut is performed to form the reflection end surfaces of adjacent edge reflection type surface acoustic-wave devices 1, that is, to form the first end surface portions. As a result, as shown in FIG. 6B, first grooves $11a$ and $11b$ are formed. First side surfaces of these first grooves $11a$ and $11b$ constitute the above-described first end surface portions $2a_1$ and $2b_1$. Accordingly, in the step of making the first half cut using the first blade, the first cut is performed under the condition that the side surface of the grooves $11a$ and $11b$ becomes smooth.

Furthermore, as a matter of course, in the step of making the first half cut, the cut by using a blade 21 is performed so as not to reach the lower surface of the piezoelectric wafer 11.

Next, a second half cut is performed by using a second blade 22 shown by an imaginary line in FIG. 6B. In this second half cut, a second groove $11c$ is formed by the blade 22. The second groove $11c$ is formed so as to have rough second end surface portions $2a_2$ and $2b_2$. Therefore, the second half cut is performed by using the second blade 22 under the condition that the lower and side surfaces of the groove $11c$ become a rough surface. Furthermore, in order to form the second end surface portions $2a_2$ and $2b_2$, the second blade 22 is preferably thicker than a portion $11d$ of the piezoelectric wafer between the first grooves $11a$ and $11b$.

As described above, the second groove $11c$ is formed and the second end surface portions $2a_2$ and $2b_2$ are formed.

Then, a full cut is performed by using a third blade 23 which is thinner than the dimension in the width direction of the second groove $11c$. In the step of making this full cut, the adjacent edge reflection type surface acoustic wave devices 1 are separated inside the second groove $11c$. The smooth third end surface portions $2a_3$ and $2b_3$ are formed by the cut.

In the present manufacturing method, in the step of making the first half cut for forming the first grooves $11a$ and $11b$ and the step of making the last full cut, a half cut and full cut are performed so that the cut surfaces become a smooth surface. Such smooth surfaces can be easily formed by using, for example, the first and third blades 21 and 23 having fine particles. Furthermore, the second blade having coarse particles may be used to form the second end surface portions $2a_2$ and $2b_2$.

In the half-cut steps, cracking and chipping hardly occur in the piezoelectric wafer even if the same blades and the same processing speed are used when compared with those used in the full-cut step. Therefore, the second end surface portions $2a_2$ and $2b_2$ having rough surfaces can be formed while reliably preventing the occurrence of cracking and breaking in the wafer. Then, after the second end surface portions $2a_2$ and $2b_2$ having such a rough surface have been formed, the step of making a full cut is performed to separate surface acoustic wave devices 1. In the step of the full cut, since the cut surface is not required to have a rough surface, chipping and broken pieces of the wafer are not produced. Therefore, as described above, when an edge reflection type surface acoustic wave device 1 having excellent characteristics is produced from a piezoelectric wafer 1, chipping and broken pieces of the wafer are reliably prevented from occurring.

In FIGS. 7A to 7E, partially cutaway sectional views for describing a second method as a preferred embodiment of the present invention are shown.

Figure 7A:
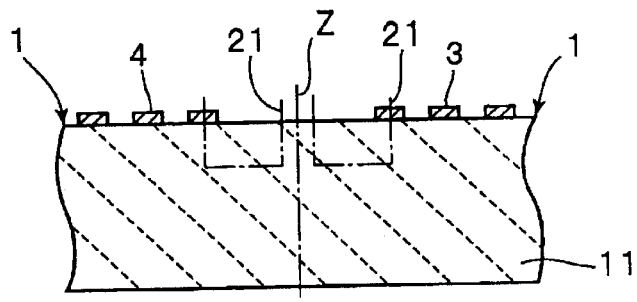
FIGS. 7A to 7E shows partially cutaway sectional views for describing a second manufacturing method according to a preferred embodiment of a manufacturing method of the present invention.
Figure 7B:
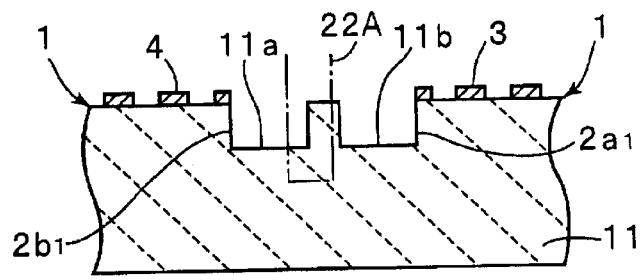
Figure 7C:
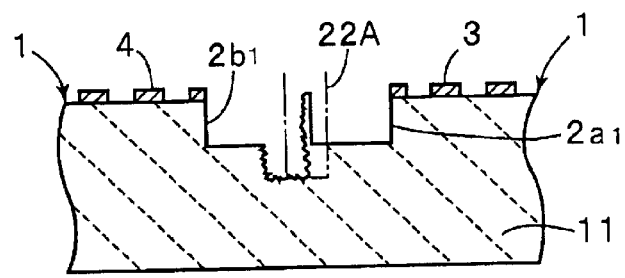

In the second method, first of all, the first grooves 11a and 11b are formed in the piezoelectric wafer 11 by using the first blade 21 in the same way as in the first method (see FIGS. 7A to 7B).

Figure 7D:
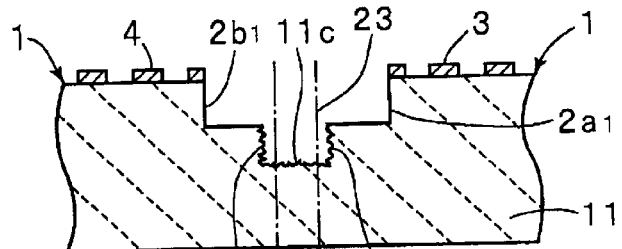
Figure 7E:
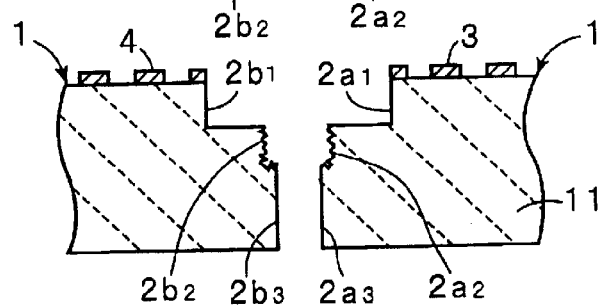

Next, a second half cut is performed by using a second blade 22A as shown in FIG. 7B. In this method, as shown in FIGS. 7A and 7B, the half cut is performed twice using the same second blade 22A, but the half-cut position is displaced. In this case, the half cut is executed twice so as to form a second groove 11c shown in FIG. 7D. In FIG. 7D, although one groove 11c having a width which is larger than the thickness of the blade 22A is formed as the second groove 11c, a second groove having a width which is preferably substantially equal to the thickness of the second blade 22A may be independently formed.

Next, a full cut is performed in the middle of the second groove 11c by using a third blade 23, having a width which is narrower than the width of the second groove 11c. Also in this case, when the second half cut is performed to form the second groove 11c, the second end surface portions $2a_2$ and $2b_2$ can be formed without having chipping and cracks produced by making the cut surface a rough surface, in the same way as in the first manufacturing method described with reference to FIGS. 6A to 6D.

Moreover, as described above, when two of the second grooves 11c are formed in the second half cut, a third blade 23, which is thicker than the space between the two second grooves and thinner than the distance between the side surfaces constituting the first end surface portions $2a_1$ and $2b_1$ of the first grooves 11a and 11b, may be used.

In the second manufacturing method, the same blade may be used as the second and third blades 22A and 23. That is, when a half cut is performed to form a rough surface by using the second blade 22A, the cutting speed is increased and the number of revolutions of the blade may be reduced. Furthermore, in the step of making the full cut, the cutting speed is decreased and the number of revolutions of the blade may be increased in order to obtain a smooth surface. Accordingly, in the second manufacturing method, the operation of changing the blades can be simplified by using the same blade for the second and third blades.

In FIGS. 8A to 8D, partially cutaway sectional views for describing a third manufacturing method as a preferred embodiment of a manufacturing method of the present invention are shown.

Figure 8A:
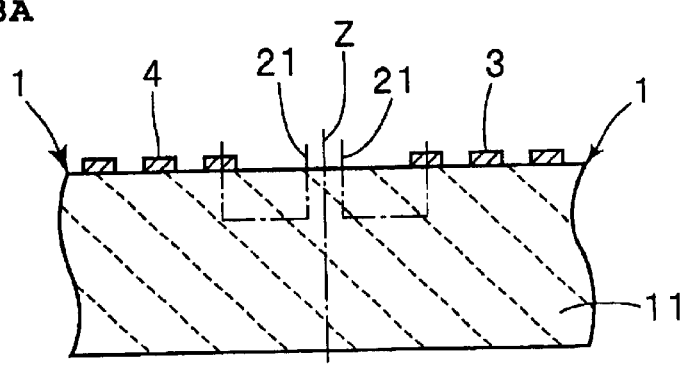
FIGS. 8A to 8D shows partially cutaway sectional views for describing a third manufacturing method according to a preferred embodiment of a manufacturing method of the present invention.
Figure 8B:
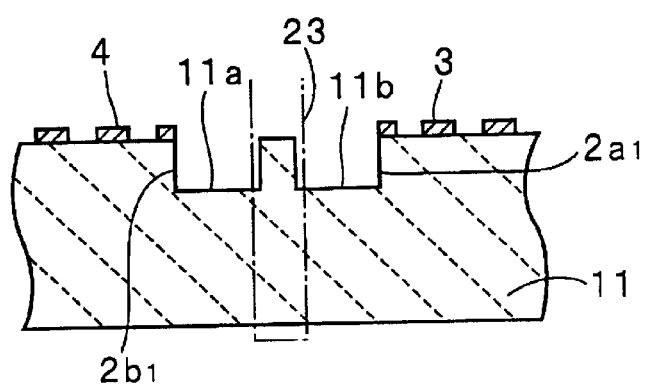

In the third manufacturing method, as shown in FIG. 8A, a first half cut is performed in the same way as in the first manufacturing method, and first grooves 11a and 11b shown in FIG. 8B are formed. Then, a full cut is performed by using a third blade 23 shown by an imaginary line in FIG. 8B. That is, the cutting is performed by using the third blade 23 so as to reach the lower surface of the piezoelectric wafer 11. In the cut, since the cut surface is made to be a smooth surface, chipping and breaking of the wafer hardly occur when compared with the case where a rough surface is formed.

Figure 8C:
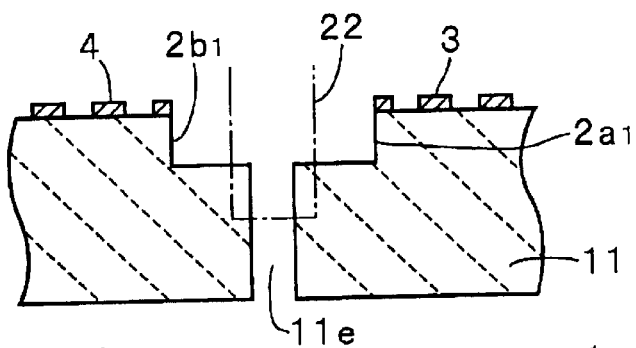
Figure 8D:
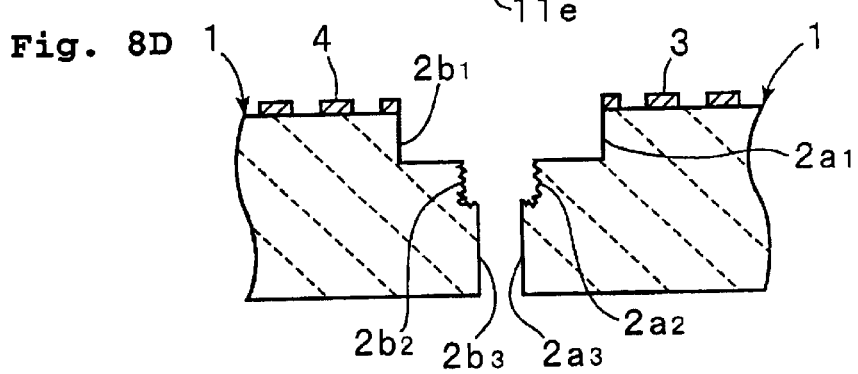

As described above, after the full cut has been performed, a second half cut is performed by using a second blade 22 as shown in FIG. 8C. Moreover, in FIG. 8C, although the adjacent edge reflection type surface acoustic wave devices 1 are separated, in a series of steps shown by FIGS. 8A to 8D, the piezoelectric wafer 11 is temporarily fixed on a cutting stage (not illustrated) by using an adhesive tape, or other suitable means. Therefore, although the adjacent edge reflection type surface acoustic wave devices 1 are separated in FIG. 8C, the space between the two is not changed. Accordingly, a next second half cut can be stably and surely performed.

The second half cut is performed by using a second blade 22 shown by an imaginary line in FIG. 8C. In this case, the thickness of the second blade 22 is larger than the width 11e of the gap formed by the step of the above-described full cut and smaller than the distance between the first and second end surface portions $2a_1$ and $2b_1$. Thus, the second half cut is performed to form the second end surface portions $2a_2$ and $2b_2$ and the surface cut by the above step of the full cut which is lower than the second end surface portions $2a_2$ and $2b_2$ constitutes the third end surface portions $2a_3$ and $2b_3$.

Also in the third manufacturing method, the second end surface portions $2a_2$ and $2b_2$ having a rough surface can be easily formed by performing the second half cut under the condition that the cut surface becomes a rough surface in the same way as in the first and second manufacturing methods. Furthermore, since no rough surface is formed in the step of making the full cut, chipping and breaking of the wafer are prevented from occurring in the second half cut.

Furthermore, in the third manufacturing method, since the full cut is performed before forming the second end surface portions $2a_2$ and $2b_2$, cracks along the half-cut grooves which may be produced in the step of making the second half cut and the removal of the wafer are reliably prevented when compared with the first and second manufacturing methods.

Figure 10:
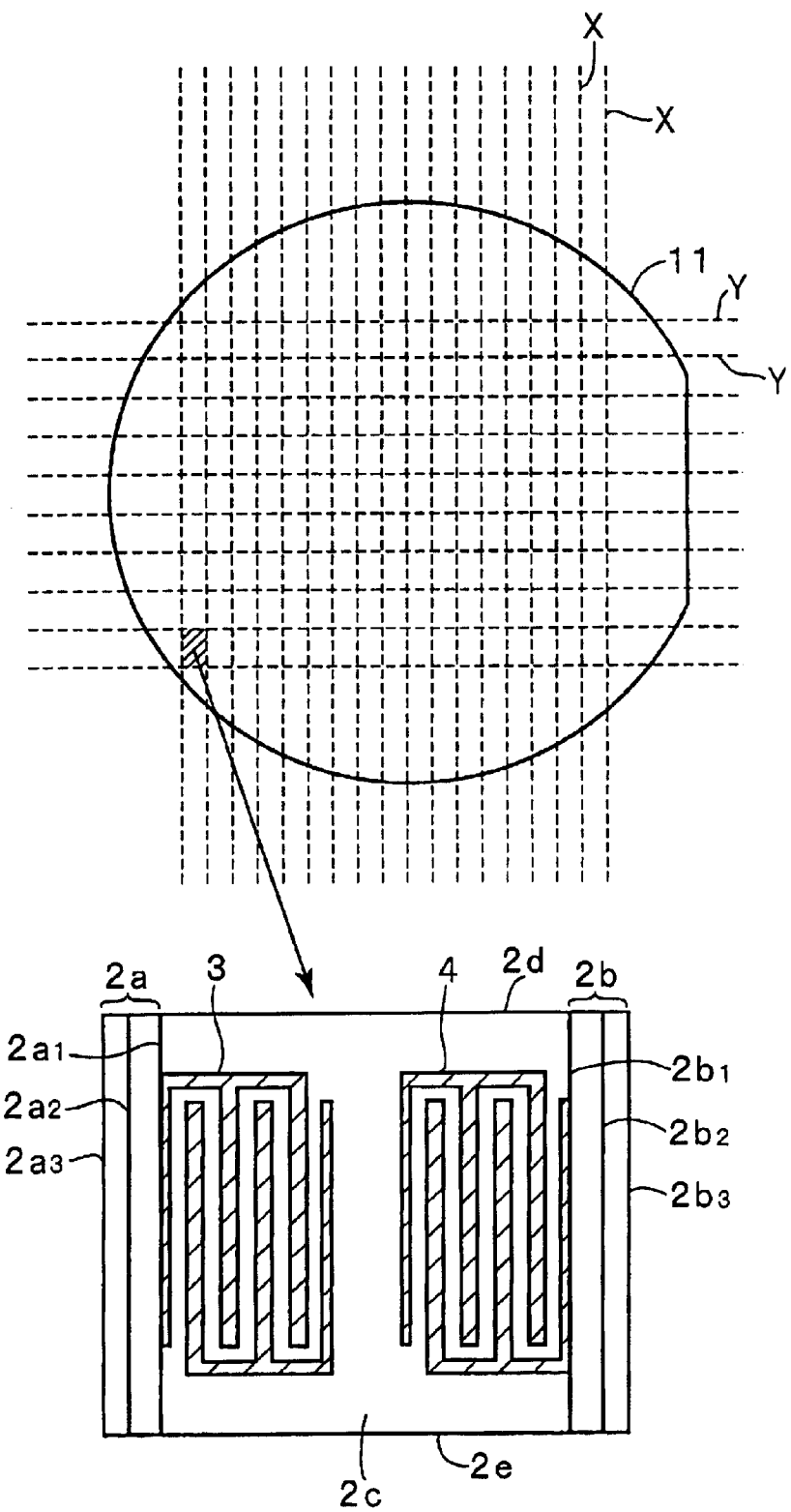
FIG. 10 is a schematic illustration for describing a process for cutting out edge reflection type surface acoustic wave devices from a piezoelectric wafer.

Moreover, in the above-described first to third manufacturing methods, regarding the adjacent edge reflection type surface acoustic wave devices 1, the step in which the side of the reflection end surface of each edge reflection type surface acoustic wave device 1 is separated is described, but, in the piezoelectric wafer, as described above, the IDTs 3 and 4 of each surface acoustic wave device are formed in the shape of a matrix. That is, as shown in FIG. 10, the piezoelectric wafer 11 is cut along broken lines X and Y in the end to obtain separate edge reflection type surface acoustic wave devices 1. In the above-described first to third manufacturing methods, the devices are cut along this broken line X. In contrast to this, the cut on the side of the side surfaces 2d and 2e in the direction substantially at a right angle to the two end surfaces opposite to each other takes place along the above broken line Y. That is, the piezoelectric wafer 11 is full cut along the broken line Y in FIG. 10. The step of making this full cut is called a second full cut.

The second full cut may be performed after the first and second half-cut steps and the full-cut step have been finished.

Furthermore, the second full cut is not necessarily required to be performed after the three-stair construction on the side of the reflection end surface has been finished. That is, in particular, after the step of the second half cut, since the first and second grooves are formed, the piezoelectric wafer becomes susceptible to cracks. Therefore, it is desirable that the step of the second full cut is performed between the making the first half cut and making the second half cut, and, in that case, cracks and chips of the piezoelectric wafer can be reliably prevented from occurring in the step of the second full cut.

However, after the first and second half-cut steps and after the second half-cut step in particular, the piezoelectric wafer has plural grooves and accordingly is very easily broken. Therefore, it is most preferable to perform the first and second half cut and the full cut according to preferred embodiments of the present invention after the second full cut has been performed in advance. That is, in the step of making the second full cut, a strip-like piezoelectric wafer portion, in which a plurality of edge reflection type surface acoustic wave devices are connected in the direction substantially at a right angle to the reflection end faces, is obtained and it is desirable to perform the first and second half-cut steps and the full-cut step in the strip-like piezoelectric wafer portion. This is because the effect of pressure applied when the piezoelectric wafer is mounted on and removed from the dicer can be reduced.

Moreover, in preferred embodiments of the present invention, a first end surface portion, a second end surface portion, and a last end surface portion may be formed, and also a plurality of second end surface portions may be formed between a first end surface portion and a last end surface portion. In this case, the step of a second half cut may be repeated to form a plurality of second end surface portions.

Furthermore, the present invention may be applied not only to the above-described edge reflection type surface acoustic wave device of a longitudinally coupled resonator type, but also to a general edge reflection type surface acoustic wave device such as an edge reflection type surface acoustic wave resonator, an edge reflection type surface acoustic wave filter having the other construction, and other suitable devices.

Furthermore, in the manufacturing methods shown in FIGS. 6A to 8D, the second end surface portions $2a_2$ and $2b_2$ extended in the direction which is substantially perpendicular to the upper surface of the piezoelectric wafer, but the second end surface portions $2a_2$ and $2b_2$ may be inclined. That is, as shown in FIGS. 9A to 9D, in the same way as the first manufacturing method, after the first half cut has been performed, a second half cut is performed by using a blade 22B, in which the closer to the tip, the thinner, and the second end surface portions $2a_2$ and $2b_2$ may be formed so as to be inclined. In this way, the second end surface portions $2a_2$ and $2b_2$ having a rough surface in an edge reflection type surface acoustic wave device of preferred embodiments of the present invention may be inclined so as to extend in a direction other than the direction that is substantially perpendicular to the upper surface of the piezoelectric substrate.

In a manufacturing method for an edge reflection type surface acoustic wave device according to a preferred embodiment of the present invention, first end surface portions defining a reflection end surface of a smooth surface is formed in the step of a first cut. After the step of the first half cut, the step of a second half cut is performed and second end surface portions having a rough surface are formed, but, since the rough surface is formed by the step of the half cut, the occurrence of chipping and cracks of the piezoelectric substrate is reliably suppressed when compared with the case where a rough surface is formed by the step of a full cut.

Accordingly, according to preferred embodiments of the present invention, since the second end surface portions preferably have a rough surface, the degradation of characteristics due to the reflection of unnecessary waves is prevented and it becomes possible to provide an edge reflection type surface acoustic wave device having excellent characteristics without having chipping and cracks being produced in the piezoelectric substrate.

According to another preferred embodiment of the present invention, since second end surface portions having surface roughness Ra of about 0.006 λ or more are formed between first end surface portions and last end surface portions, an edge reflection type surface acoustic wave device having excellent characteristics, in which the deviation of group delay time characteristics is very small, can be provided.

In an edge reflection type surface acoustic wave device according to yet another preferred embodiment of the present invention, since first end surface portions, second end surface portions having a rough surface, and last end surface portions are provided and the dimension d1 in the direction of depth of the first end surface portions is in the range of about 1.8 λ to about 3.8 λ, an edge reflection type surface acoustic wave device having excellent characteristics, in which the deviation of group delay time characteristics is very small, can be provided.

In another preferred embodiment of the present invention, since the dimension d2 in the direction of depth of second end surface portions having a rough surface, which is disposed between first end surface portions and last end surface portions, is about 0.5 λ or more, an edge reflection type surface acoustic wave device having excellent characteristics, in which the deviation of group delay time characteristics is small, can be provided.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. An edge reflection type surface acoustic wave device comprising:

a piezoelectric substrate having opposing two end surfaces defining reflection end surfaces;

at least one IDT disposed on the piezoelectric substrate having an upper surface and a lower surface;

first end surface portions having a smooth surface defining the opposing two end surfaces, extending from the upper surface to a height not reaching the lower surface of the piezoelectric substrate;

last end surface portions having a smooth surface extending upward from the lower surface of the piezoelectric substrate and located outside of the first end surface portions in the surface acoustic wave propagation direction; and second end surface portions having surface roughness Ra of about 0.006λ or greater, disposed between the first end surface portions and the last end surface portions.

2. An edge reflection type surface acoustic wave device as claimed in claim 1, wherein, when the dimension in the depth direction of the first end surface portions is represented by d1, $1.8\lambda \leq d1 \leq 3.5\lambda$.

3. An edge reflection type surface acoustic wave device as claimed in claim 1, wherein, when the dimension in the depth direction of the second end surface portions is represented by d2, $d2 \geqq 0.5 \lambda$.

4. An edge reflection type surface acoustic wave device comprising:
- a piezoelectric substrate having opposing two end surfaces defining as reflection end surfaces and having an upper surface and a lower surface;
- at least one IDT disposed on the piezoelectric substrate;
- first end surface portions having a smooth surface defining the reflection end surfaces and extending from the upper surface to a height not reaching the lower surface of the piezoelectric substrate;
- last end surface portions having a smooth surface extending upward from the lower surface of the piezoelectric substrate and located outside of the first end surface portions in the surface acoustic wave propagation direction; and
- second end surface portions having a rough surface, disposed between the first end surface portions and the last end surface portions;
- wherein, when the dimension in the depth direction of the first end surface portions is represented by d1, $1.8\lambda \leqq d1 \leqq 3.5\lambda$.

5. An edge reflection type surface acoustic wave device comprising;
- a piezoelectric substrate having opposing two end surfaces defining reflection end surfaces and having an upper surface and a lower surface;
- at least one IDT disposed on the piezoelectric substrate;
- first end surface portions having a smooth surface and defining the reflection end surfaces, extending from the upper surface to a height not reaching the lower surface of the piezoelectric substrate;
- last end surface portions having a smooth surface extending upward from the lower surface of the piezoelectric substrate and located outside of the first end surface portions in the surface acoustic wave propagation direction; and
- second end surface portions having a rough surface, disposed between the first end surface portions and the last end surface portions,
- wherein, when the dimension in the depth direction of the second end surface portions is represented by d2, $d2 \geqq 0.5 \lambda$.

* * * * *